United States Patent [19]

Széchényi

[11] 4,132,865
[45] Jan. 2, 1979

[54] ELECTRONIC SWITCH

[75] Inventor: Kálmán Széchényi, Stuttgart, Germany

[73] Assignee: International Standard Electric Corporation, New York, N.Y.

[21] Appl. No.: 837,672

[22] Filed: Sep. 29, 1977

[30] Foreign Application Priority Data

Oct. 1, 1976 [DE] Fed. Rep. of Germany ....... 2644402

[51] Int. Cl.² .............. H04Q 3/50; H03K 17/60; H01L 27/02
[52] U.S. Cl. .............. 179/18 GF; 307/297; 357/51
[58] Field of Search .......... 307/200 A, 200 B, 296 R, 307/297, 237; 357/41, 45, 47, 48, 50, 51; 361/100; 179/18 GF

[56] References Cited

U.S. PATENT DOCUMENTS

| 3,657,575 | 4/1972 | Taniguchi et al. | 307/297 |
| 3,688,051 | 8/1972 | Aagaard | 179/18 GF |
| 3,934,159 | 1/1976 | Nomiya et al. | 357/41 |
| 3,940,785 | 2/1976 | Genesi | 357/51 |
| 3,967,295 | 6/1976 | Stewart | 357/51 |
| 4,028,564 | 6/1977 | Streit et al. | 307/297 |

Primary Examiner—Thomas A. Robinson
Attorney, Agent, or Firm—John T. O'Halloran; Jeffrey P. Morris

[57] ABSTRACT

An electronic switch including a MOS transistor is disclosed wherein a monitoring circuit is allotted which when the bias of the MOS transistor fails prevents negative input voltages from unintentionally turning on the MOS transistor. When a plurality of MOS transistors are used as switching elements each matrix is allotted one monitoring circuit, each of which includes a MOS transistor.

12 Claims, 4 Drawing Figures

ELECTRONIC SWITCH

BACKGROUND OF THE INVENTION

The present invention relates to an electronic switch.

The use of electronic switches involves the difficulty that, because of the physical properties of the semiconductor devices used, e.g., MOS transistors, inductively or capacitively caused changes in the potential on an input may result in an abnormal switching behaviour of the switch. This is particularly undesirable if a plurality of switches are realized using integrated circuit technology, because other components will be disturbed, too, and if the switches are used as switching elements in switching networks, crosstalk and disturbing noise will occur.

In an N-MOS transistor, during normal operation, the source-substrate and drain-substrate junctions must be reverse-biased, and drain and source must be more positive than the substrate. The MOS transistor is controlled by opening and closing the channel by means of the gate-to-source voltage. The channel is open, i.e., the switch is closed, when the gate-to-source voltage exceeds the threshold voltage of the MOS transistor.

If, however, the potential of the input becomes negative, the source-substrate np junction will open, and substrate current will flow; with the drain-source junction reverse-biased, an npn transistor can form, with emitter = source, base = substrate, and collector = drain. As a result, the channel is indirectly rendered conductive, i.e., the switch is inadvertently turned on. The channel is also rendered conductive when the negative potential of the source exceeds the threshold voltage.

The object of the invention is to avoid these disturbances of the switch due to a negative potential at the input.

SUMMARY OF THE INVENTION

According to the invention, this is achieved by an n(p)-channel MOS transistor whose drain and source terminals are connected to a first potential via one protective diode each having a forward voltage lower than the threshold voltage of the MOS transistor, and whose substrate terminal is connected to a second potential via a first output of a switch, with the first potential chosen to be greater (smaller) than the second potential, and by a monitoring circuit which operates the switch in the absence of potential (first potential = second potential), whereby the substrate is connected to zero potential via a second output of the switch and via a suitably biased diode. This makes it possible, for example, to manufacture integrated switching matrices using MOS transistors which are protected against negative potential on the speech wires at low cost.

The invention will now be explained with reference to the accompanying drawing, in which:

BRIEF DESCRIPTION OF THE DRAWINGS

FIG. 2 is an embodiment of the monitoring and switching circuit of FIG. 1a, and

DESCRIPTION OF THE PREFERRED EMBODIMENT

Figure 1A:
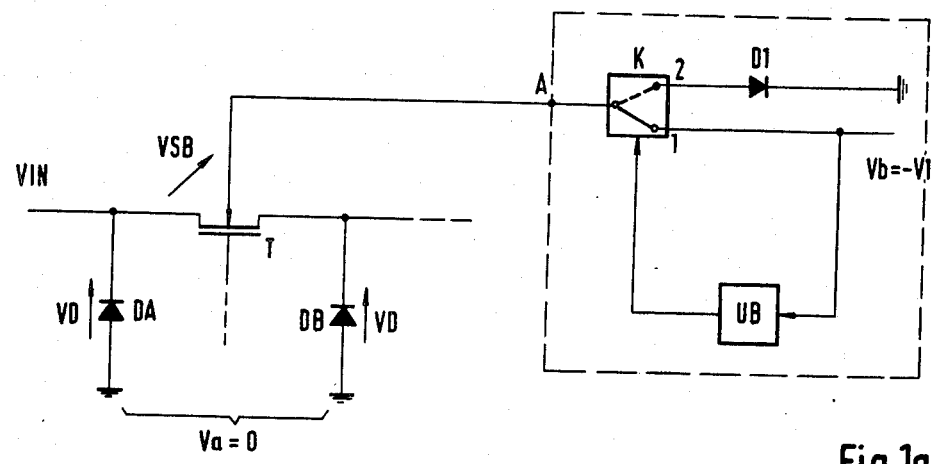
FIGS. 1a and 1b are schematic circuit diagrams of the electronic switch according to the invention.

FIG. 1a shows a schematic circuit diagram of the electronic switch according to the invention. Connected to the drain and source terminals of an N-MOS transistor T are protective diodes DA and DB, respectively, which are at the potential Va = 0 (−ground). It is therefore necessary to bias the substrate negatively in order to keep the source-substrate and drain-substrate junctions reverse-biased. To this end, the substrate terminal is connected to the potential Vb = −V1 by means of a switch K in the position 1. When this bias −V1 fails, however, any coupled-in, negative potential VIN at the input can open the source-substrate junction and can thus cause a substrate current which, if integrated circuit technology is used (several switches on one chip), will adversely affect the operation of the other switches. In addition, the channel will turn on when the negative potential at the source terminal exceeds the threshold voltage VT of the MOS transistor. The relationship between the threshold voltage VT of the MOS transistor and the source-to-substrate voltage VSB is given by:

$$VT = VTO + k_o(\sqrt{VSB + \phi} - \sqrt{\phi}),$$

where $k_o$ = constant, $\phi$ = Fermi potential, and VTO = source-to-substrate voltage at VSB = 0. This dependence leads to the condition VD < VT, i.e., the forward voltages of the protective diodes DA and DB must be lower than the threshold voltage VT.

To prevent the source-substrate junction from being opened to a negative input potential, VIN, a monitoring circuit UB is provided which monitors the bias $Vb - Va = -V1$. When this bias fails, the monitoring circuit UB causes the switch K to switch to the position 2, whereby the substrate is connected to zero potential through a diode D1. The diode D1 then cooperates with the substrate-source junction, which acts as a diode, too (=back-to-back diodes). As a result, virtually the whole input voltage drops across the diode D1, while the voltage drop across the source-substrate junction is very small. Thus, a negative input potential is no longer capable of opening the source-substrate junction. This prevents the inlets and outlets of a matrix using integrated circuit technology from being coupled together; on the contrary, the inlets and outlets remain isolated from each other.

Figure 1B:
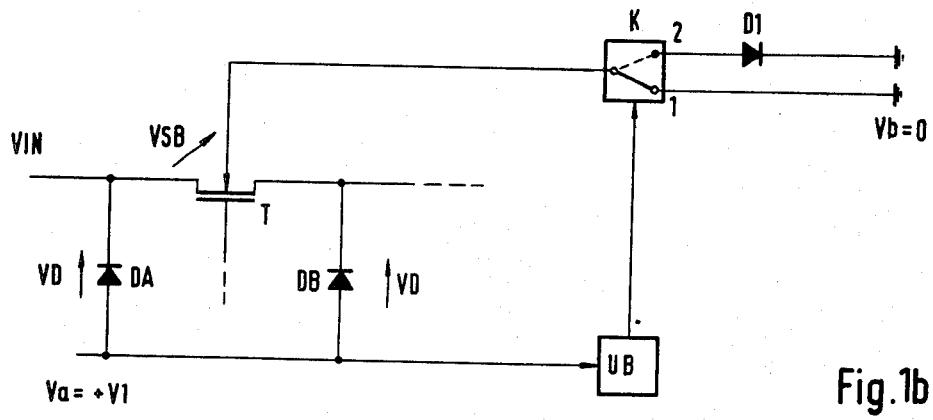

In FIG. 1b, $Va = +V1$ and $Vb = 0$. In this case, too, the bias $Vb - Va = -V1$. Otherwise, the remarks on FIG. 1a apply accordingly except that the bias sources are loaded differently.

Figure 2:
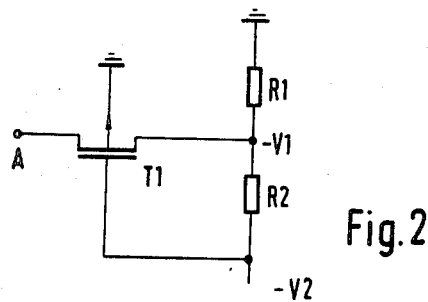

FIG. 2 shows an embodiment of the bias-monitoring and switching circuit surrounded by a broken line in FIG. 1a.

In FIG. 2, the bias −V1 is derived from a voltage −V2 by means of a voltage divider R1, R2. Under normal operating conditions, the bias −V1 is fed to the substrate electrode. When this bias fails, a P-MOS transistor T1 is cut off, because its gate voltage fails, too. In this case, the substrate electrode of the MOS transistor T is grounded through the source-substrate junction, with the source-substrate junction of the transistor T1 performing the function of the diode D1 of FIG. 1a. At a negative input potential VIN and with V2 = V1 = 0, no substrate current flows, and the source-to-substrate voltage VSB ≈ 0. Taking this into account in the dependence of the threshold voltage VT on the source-to-substrate voltage VSB gives $VT = VTO$; hence, the condition for the forward voltage of the protective diodes DA, DB is $VD<VTO$.

Figure 3:
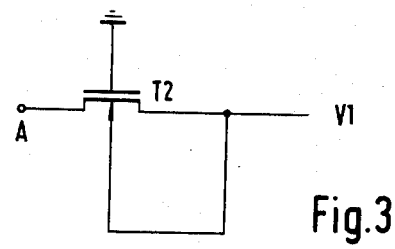
FIG. 3 is a circuit diagram of another embodiment of the invention.

FIG. 3 shows another possibility of achieving the objective of the invention. An N-MOS transistor T2 is connected to the substrate of the transistor T, and under normal operating conditions supplies this substrate with the bias $-V1$. When the bias fails, the channel of T2 turns off. The source-to-substrate junction of T2 forms a diode, too, which, however, is connected in the opposite direction to that of the diode D1 of FIG. 1a and in the embodiment of FIG. 2. This diode (substrate-source junction of T2) and the other diode (source-substrate junction of T) then forms a series combination of two diodes connected in the same direction. The voltage drop across the source-substrate junction of T is then dependent on the characteristics of both diodes; for instance, if the diodes have the same characteristic, it is approximately $VD/2$. Taking this into account in the dependence of the threshold voltage VT on the source-to-substrate voltage VSB gives $VT \leq VTO$ and, consequently, $VD<VT$ for the forward voltages VD of the protective diodes VA and VB. As a result of the exponential dependence of the diode current on the diode voltage, a voltage drop of $VD/2$ across the source-substrate junction only causes a substrate current which has no disturbing effects.

When used in a switching matrix, the solutions shown in FIGS. 2 and 3 secure the "off" state of a switching element against negative input voltages which, if the switching elements are made using integrating circuit technology and are not protected, may result in failure of the whole matrix.

The protective diodes prevent the channel from being turned on by negative input voltages exceeding the threshold voltage.

Additional electronic elements (e.g., transistors T1, T2) prevent the generation of a substrate current and, thus, any parasitic coupling between the switching elements. If realized using integrated circuit technology, these additional elements can be fabricated on the same chip as the switching elements at a low cost.

The measures according to the invention thus improve the operational reliability of the switching elements.

In addition, steps may be taken to ensure that in case the bias V1 fails, the additional elements also prevent any continued use of the switching elements of a matrix. This can be accomplished by either switching off all supply voltages of the matrix or reporting to a central station.

What is claimed is:

1. An electronic switch comprising:
   first MOS transistor means, including drain and source terminals;
   first potential connected to said drain and source terminals via first and second protective diodes respectively, each of said protective diodes having a forward voltage lower than the threshold voltage of said MOS transistor;
   switch means for connecting the substrate terminal of said MOS transistor to a second potential through a first output of said switch means such that said first potential is greater than said second potential; and
   monitoring circuit means for controlling said switch means when said first and second potentials become equal such that said substrate is connected to zero potential through a second output of said switch means, said zero potential path including a diode.

2. An electronic switch in accordance with claim 1 wherein said first potential is less than said second potential.

3. An electronic switch in accordance with claim 1 further comprising:
   an additional MOS transistor means having a source terminal connected to the substrate terminal of said first MOS transistor, a drain terminal connected to said second potential and a substrate terminal connected to ground such that upon failure of bias potential, said additional MOS transistor is caused to switch to the non-conducting state.

4. An electronic switch in accordance with claim 3 wherein the gate potential of said first MOS transistor means and said second potential are derived from a common potential.

5. An electronic switch in accordance with claim 1 further comprising:
   a single integrated circuit chip means upon which all of said above mentioned means are fabricated.

6. In a telephone switching system, an integrated switching matrix including a plurality of switching elements in said switching matrix with one monitoring circuit, one switch and one diode assigned jointly to said matrix and wherein each of said switching elements comprises:
   MOS transistor means, including drain and source terminals;
   first potential connected to said drain and source terminals via first and second protective diodes respectively, each of said protective diodes having a forward voltage lower than the threshold voltage of said MOS transistor;
   switch means for connecting the substrate terminal of said MOS transistor to a second potential through a first output of said switch means such that said first potential is greater than said second potential;
   monitoring circuit means for controlling said switch means when said first and second potentials become equal such that said substrate is connected to zero potential through a second output of said switch means, said zero potential path including a diode.

7. In a telephone switching system, an integrated switching matrix in accordance with claim 6 wherein each of said switching elements further includes:
   an additional MOS transistor having a source terminal connected to the substrate terminal of said first transistor, a drain terminal connected to said second potential and a substrate terminal connected to ground such that upon failure of bias potential, said additional MOS transistor is caused to switch to the non-conducting state.

8. A telephone switching system in accordance with claim 6 further comprising:
   a single integrated circuit chip upon which all of said above mentioned means are fabricated.

9. An electronic switch comprising:
   an $-n(p)$-channel MOS transistor means having drain and source terminals;
   a pair of protective diode means, one of which diode means is coupled to said drain and the other of which diode means is coupled to said source for connecting said source and drain terminals to a source of zero potential, said protective diodes each having a forward voltage lower than the threshold voltage of said MOS transistor;

means for connecting the substrate terminal of said MOS transistor to a negative potential, said last mentioned means including the channel of a second MOS transistor, the substrate terminal of said second MOS transistor being connected to a negative potential and having the gate terminal thereof grounded and the threshold voltage of the said second MOS transistor being higher than said negative potential.

10. An electronic switch in accordance with claim 9 further comprising:

a single integrated circuit chip upon which all of said above mentioned means are fabricated.

11. In a telephone switching system, an integrated matrix including a plurality of switching elements wherein each of said switching elements comprises:

MOS transistor means having drain and source terminals;

a pair of protective diode means, one of which diode means is coupled to said drain and the other of which diode means is coupled to said source for connecting said source and drain terminals to a source of zero potential, said protective diodes each having a forward voltage lower than the threshold voltages of said MOS transistor;

means for connecting the substrate terminals of said MOS transistor to a negative potential, said last mentioned means including second MOS transistor means, the substrate terminal of said second MOS transistor means being connected to a negative potential and having the gate terminal thereof grounded and the threshold voltage of the said second MOS transistor being higher than said negative potential.

12. A telephone switching system in accordance with claim 11 further comprising:

a single integrated circuit chip means upon which all of said above mentioned means are fabricated.

* * * * *